United States Patent
Liu et al.

(10) Patent No.: US 10,497,808 B2
(45) Date of Patent: *Dec. 3, 2019

(54) METHOD OF MAKING A CMOS SEMICONDUCTOR DEVICE USING A STRESSED SILICON-ON-INSULATOR (SOI) WAFER

(71) Applicant: STMICROELECTRONICS, INC., Coppell, TX (US)

(72) Inventors: Qing Liu, Irvine, CA (US); Nicolas Loubet, Guilderland, NY (US)

(73) Assignee: STMICROELECTRONICS, INC., Coppell, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/035,458

(22) Filed: Jul. 13, 2018

(65) Prior Publication Data

US 2018/0323301 A1 Nov. 8, 2018

Related U.S. Application Data

(63) Continuation of application No. 15/162,441, filed on May 23, 2016, now Pat. No. 10,043,907, which is a
(Continued)

(51) Int. Cl.
*H01L 29/78* (2006.01)
*H01L 21/8238* (2006.01)
(Continued)

(52) U.S. Cl.
CPC .... *H01L 29/7849* (2013.01); *H01L 21/02532* (2013.01); *H01L 21/2251* (2013.01);
(Continued)

(58) Field of Classification Search
CPC ........... H01L 21/8238; H01L 21/76264; H01L 21/02532; H01L 21/823807; H01L 27/1203; H01L 29/7848; H01L 29/7849; H01L 21/823814; H01L 29/7842; H01L 29/1054; H01L 29/165; H01L 27/1207; H01L 21/76283; H01L 21/7624; H01L 27/0922; H01L 29/4908
See application file for complete search history.

(56) References Cited

U.S. PATENT DOCUMENTS 7,208,815 B2 4/2007 Chen et al.
7,238,580 B2 7/2007 Orlowski et al.
(Continued)

*Primary Examiner* — Bac H Au
(74) *Attorney, Agent, or Firm* — Seed IP Law Group LLP

(57) ABSTRACT

A method for forming a complementary metal oxide semiconductor (CMOS) semiconductor device includes providing a stressed silicon-on-insulator (sSOI) wafer comprising a stressed semiconductor layer having first and second laterally adjacent stressed semiconductor portions. The first stressed semiconductor portion defines a first active region. The second stressed semiconductor portion is replaced with an unstressed semiconductor portion. The unstressed semiconductor portion includes a first semiconductor material. The method further includes driving a second semiconductor material into the first semiconductor material of the unstressed semiconductor portion defining a second active region.

20 Claims, 7 Drawing Sheets

Related U.S. Application Data continuation of application No. 14/675,156, filed on Mar. 31, 2015, now Pat. No. 9,466,720, which is a continuation of application No. 14/048,263, filed on Oct. 8, 2013, now Pat. No. 9,018,057.

(51) Int. Cl.

| | |
|---|---|
| *H01L 29/66* | (2006.01) |
| *H01L 21/762* | (2006.01) |
| *H01L 29/10* | (2006.01) |
| *H01L 29/49* | (2006.01) |
| *H01L 29/165* | (2006.01) |
| *H01L 21/02* | (2006.01) |
| *H01L 21/84* | (2006.01) |
| *H01L 27/12* | (2006.01) |
| *H01L 21/225* | (2006.01) |
| *H01L 27/092* | (2006.01) |
| *H01L 29/06* | (2006.01) |
| *H01L 29/161* | (2006.01) |

(52) U.S. Cl.
CPC .... *H01L 21/7624* (2013.01); *H01L 21/76264* (2013.01); *H01L 21/76283* (2013.01); *H01L 21/8238* (2013.01); *H01L 21/823807* (2013.01); *H01L 21/823814* (2013.01); *H01L 21/823892* (2013.01); *H01L 21/84* (2013.01); *H01L 21/845* (2013.01); *H01L 27/092* (2013.01); *H01L 27/1203* (2013.01); *H01L 29/0649* (2013.01); *H01L 29/1054* (2013.01); *H01L 29/161* (2013.01); *H01L 29/165* (2013.01); *H01L 29/4908* (2013.01); *H01L 29/66742* (2013.01); *H01L 29/7842* (2013.01); *H01L 29/7848* (2013.01)

(56) References Cited

U.S. PATENT DOCUMENTS

| | | |
|---|---|---|
| 9,018,057 B1 | 4/2015 | Liu et al. |
| 10,043,907 B2 * | 8/2018 | Liu .................. H01L 21/823807 |
| 2006/0125008 A1 | 6/2006 | Chidambarrao et al. |
| 2006/0292770 A1 | 12/2006 | Wu et al. |
| 2007/0015347 A1 | 1/2007 | Mehta et al. |
| 2007/0069294 A1 | 3/2007 | Chidambarrao et al. |
| 2007/0145481 A1 | 6/2007 | Tilke et al. |
| 2007/0196987 A1 | 8/2007 | Chidambarrao et al. |
| 2007/0254423 A1 | 11/2007 | Chidambarrao et al. |
| 2008/0303090 A1 | 12/2008 | Ieong et al. |
| 2009/0236663 A1 | 9/2009 | Teo et al. |
| 2009/0291540 A1 | 11/2009 | Zhang et al. |
| 2010/0047985 A1 | 2/2010 | Dakshina Murthy et al. |
| 2010/0109044 A1 | 5/2010 | Tekleab et al. |
| 2010/0171180 A1 | 7/2010 | Zhang et al. |
| 2012/0025266 A1 | 2/2012 | Griebenow et al. |
| 2013/0029478 A1 | 1/2013 | Zhang et al. |

* cited by examiner

METHOD OF MAKING A CMOS SEMICONDUCTOR DEVICE USING A STRESSED SILICON-ON-INSULATOR (SOI) WAFER

FIELD OF THE INVENTION

The present invention relates to the field of electronic devices, and more particularly, to a method of making semiconductor devices.

BACKGROUND OF THE INVENTION

Some semiconductor devices utilize semiconductor-on-insulator (SOI) technology, in which a thin layer of a semiconductor, such as silicon, is separated from a semiconductor substrate by a relatively thick electrically insulating layer. This thick electrically insulating layer is also referred to as a buried oxide (BOX) layer. The semiconductor layer typically has a thickness of a few nanometers, whereas the semiconductor substrate typically has a thickness of a few tens of nanometers.

SOI technology offer certain advantages compared to traditional bulk technology for Complementary Metal Oxide Semiconductor (CMOS) devices. CMOS devices include nMOSFET transistors and pMOSFET transistors both formed in the thin silicon layer which overlies the buried oxide (BOX) layer. SOI technology allows CMOS devices to operate at lower power consumption while providing the same performance level.

One particular type of SOI technology that is helping to allow for continued CMOS scaling is fully depleted SOI (FDSOI). As opposed to a partially depleted SOI (PDSOI) device, in an FDSOI device a relatively thin semiconductor channel layer is provided over the buried oxide (BOX) layer, such that the depletion region of the device covers the whole layer. FDSOI devices may provide advantages such as higher switching speeds and a reduction in threshold voltage roll off, as compared to PDSOI devices, for example.

To improve CMOS device performance, stress may be introduced into the channels of the field effect transistors (FETs). When applied in a longitudinal direction (i.e., in the direction of current flow), tensile stress is known to enhance electron mobility (i.e., n-channel MOSFET drive currents) while compressive stress is known to enhance hole mobility (i.e., p-channel MOSFET drive currents).

Consequently, tensile strained silicon-on-insulator (sSOI) is a main performance driver for nMOSFET transistors, and compressive strained silicon-germanium-on-insulator (SGOI) is a main performance driver for pMOSFET transistors.

To form an SGOI pMOSFET transistor on an sSOI substrate or wafer is difficult. Growing SiGe on an sSOI wafer often times leads to a rough surface resulting in mobility loss. In addition, a high germanium content in the silicon-germanium is needed to compensate for tensile strain. Otherwise, this leads to a high density of interface trap (DIT) value, where the DIT designates a density of traps at an interface between two layers.

One approach for forming a stressed Si/SiGe dual channel device is disclosed in U.S. published patent application no. 2013/0029478. An epitaxial SiGe layer is formed on an SOI substrate, and an Si cap layer is formed on the SiGe layer. A photoresist layer is formed on the Si cap layer, and part of the Si cap layer is removed. A Si layer is epitaxially grown on the exposed SiGe layer. An ion implantation is performed to distribute implanted ions within the silicon cap layer. Annealing is performed to relax the stress in part of the SiGe layer and transfer stress to the epitaxial Si material thereon to form strained silicon. The formed strained silicon is used to form an nMOSFET transistor channel and the region of the SiGe layer covered by photoresist is used to form a pMOSFET transistor channel.

Despite the existence of such configurations, further enhancements in SOI devices may be desirable in some applications, particularly when the SOI wafer is a stressed SOI wafer.

SUMMARY OF THE INVENTION

A method for forming a complementary metal oxide semiconductor (CMOS) semiconductor device comprises providing a stressed silicon-on-insulator (sSOI) wafer comprising a stressed semiconductor layer having first and second laterally adjacent stressed semiconductor portions, with the first stressed semiconductor portion defining a first active region. The method may further comprise replacing the second stressed semiconductor portion with an unstressed semiconductor portion, with the unstressed semiconductor portion comprising a first semiconductor material. A second semiconductor material may be driven into the first semiconductor material of the unstressed semiconductor portion to define a second active region.

The first semiconductor material may comprise silicon, and the second semiconductor material may comprise silicon and germanium. The second active region is advantageously formed in a relatively straightforward manner without the need for complex steps.

A mask layer may be formed over the first stressed semiconductor portion before replacing the second stressed semiconductor portion with the unstressed semiconductor portion.

Replacing the second stressed semiconductor portion with the unstressed semiconductor portion may comprises removing the second stressed semiconductor portion except for a second stressed semiconductor portion bottom layer, and forming the unstressed semiconductor portion on the second stressed semiconductor portion bottom layer. The second stressed semiconductor portion bottom layer may be annealed before forming the unstressed semiconductor portion. In addition, the unstressed semiconductor portion may also be annealed.

Driving the second semiconductor material into the first semiconductor material may comprise forming a second semiconductor layer comprising the second semiconductor material over the unstressed semiconductor portion, and oxidizing the second semiconductor layer to drive the second semiconductor material into the first semiconductor material.

The method may further comprise forming first and second gate stacks over the first and second active regions, respectively. First raised source and drain regions defining a first channel therebetween may be formed in the first active region under the first gate stack. Second raised source and drain regions defining a second channel therebetween may be formed in the second active region under the second gate stack.

The stressed SOI wafer may comprises a fully depleted SOI (FDSOI) wafer. The first active region may be for an n-channel metal-oxide semiconductor field-effect transistor, and the second active region may be for a p-channel metal-oxide semiconductor field-effect transistor.

DETAILED DESCRIPTION OF THE PREFERRED EMBODIMENTS

The present embodiments will now be described more fully hereinafter with reference to the accompanying drawings, in which preferred embodiments are shown. The embodiments may, however, be embodied in many different forms and should not be construed as limited to the embodiments set forth herein. Rather, these embodiments are provided so that this disclosure will be thorough and complete, and will fully convey the scope of the disclosure to those skilled in the art. Like numbers refer to like elements throughout.

Figure 1:
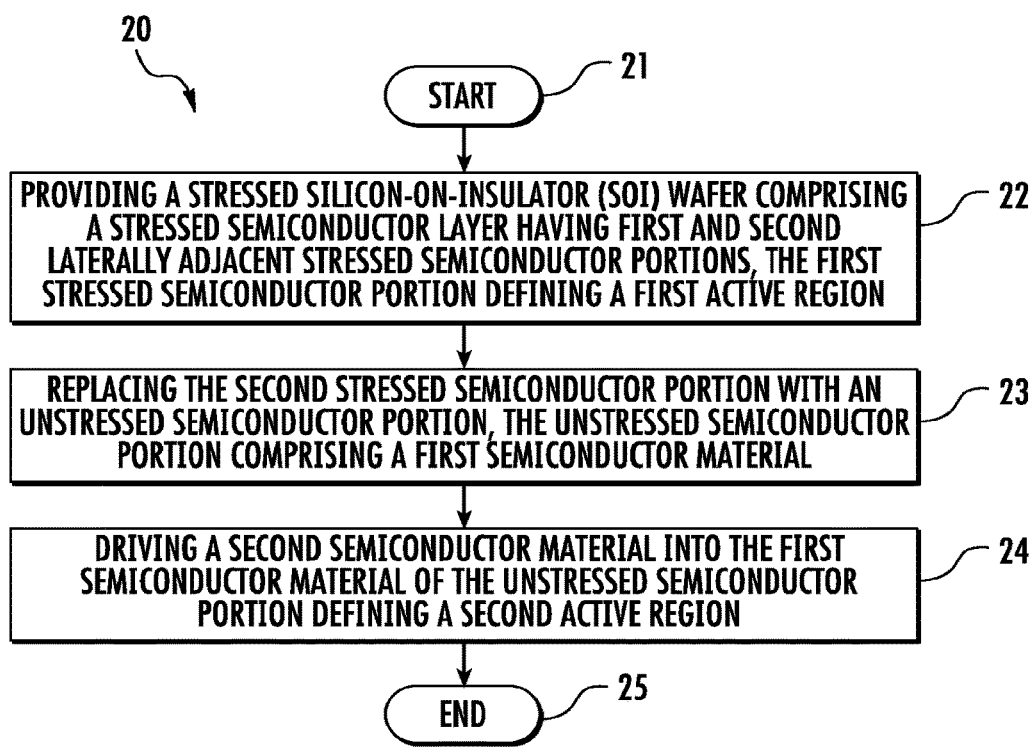
FIG. 1 is a top-level flowchart illustrating a method for forming a complementary metal oxide semiconductor (CMOS) semiconductor device in accordance with the present embodiment.

Referring initially to the flowchart 20 in FIG. 1, a method for forming a complementary metal oxide semiconductor (CMOS) semiconductor device includes, from the start (Block 21), providing a stressed silicon-on-insulator (sSOI) wafer at Block 22 comprising a stressed semiconductor layer having first and second laterally adjacent stressed semiconductor portions, with the first stressed semiconductor portion defining a first active region. The method further comprises replacing the second stressed semiconductor portion at Block 23 with an unstressed semiconductor portion, with the unstressed semiconductor portion comprising a first semiconductor material. A second semiconductor material may be driven into the first semiconductor material of the unstressed semiconductor portion at Block 24 to define a second active region. The method ends at Block 25.

The first semiconductor material may comprise silicon, and the second semiconductor material may comprise silicon and germanium. The second active region is advantageously formed in a relatively straightforward manner without the need for complex steps.

As will be discussed in greater detail below, a silicon-germanium-on-insulator (SGOI) p-channel metal-oxide semiconductor field-effect (pMOSFET) transistor is formed on a stressed silicon-on-insulator (sSOI) wafer. The stressed silicon on the sSOI corresponding to the pMOSFET is intentionally thinned, and a silicon-germanium layer is formed on the thinned stressed silicon. An n-channel metal-oxide semiconductor field-effect (nMOSFET) transistor is formed in the stressed silicon-on-insulator (sSOI) wafer.

Figure 2:
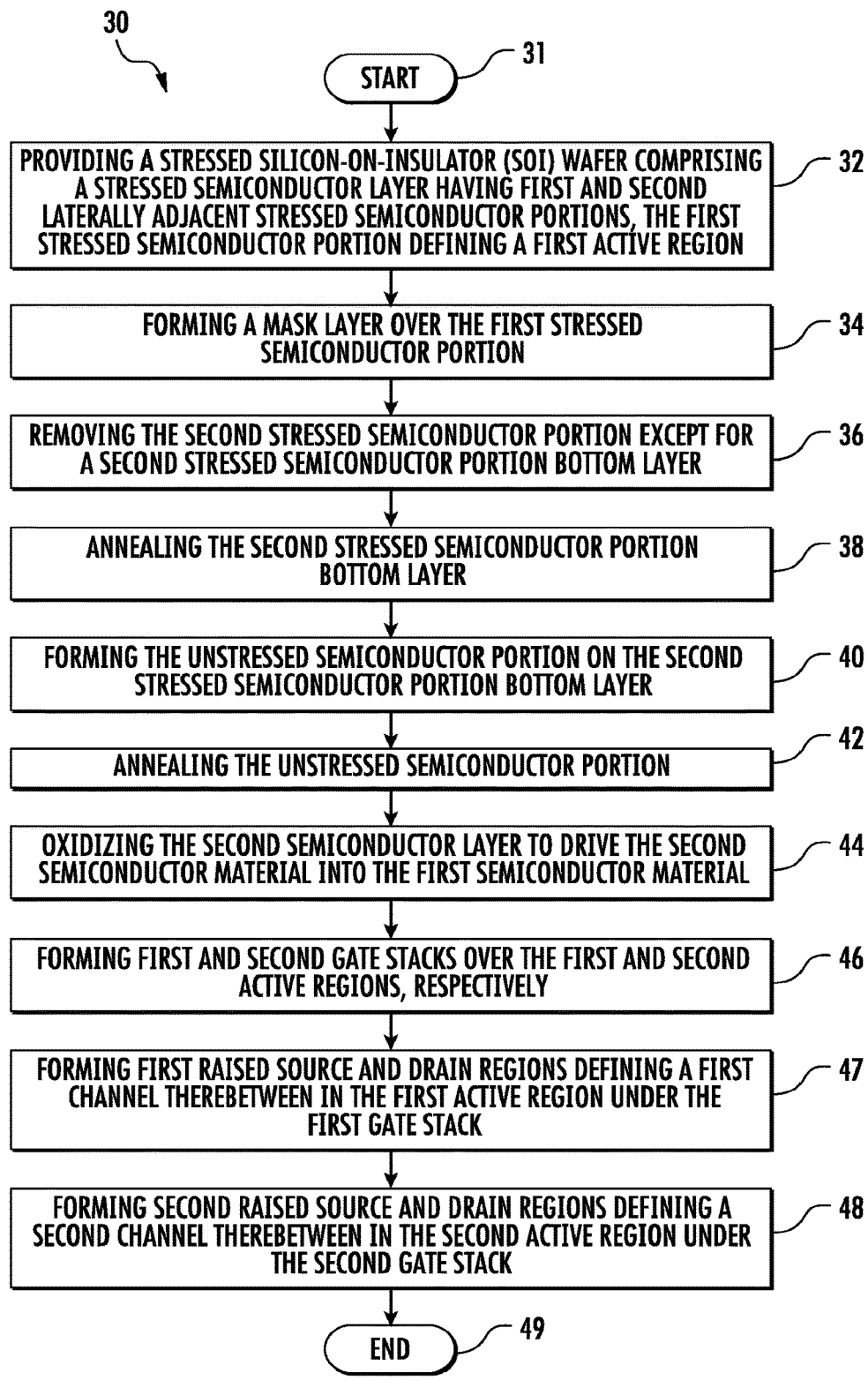
FIG. 2 is a more detailed flowchart illustrating the method of FIG. 1.
Figure 3:
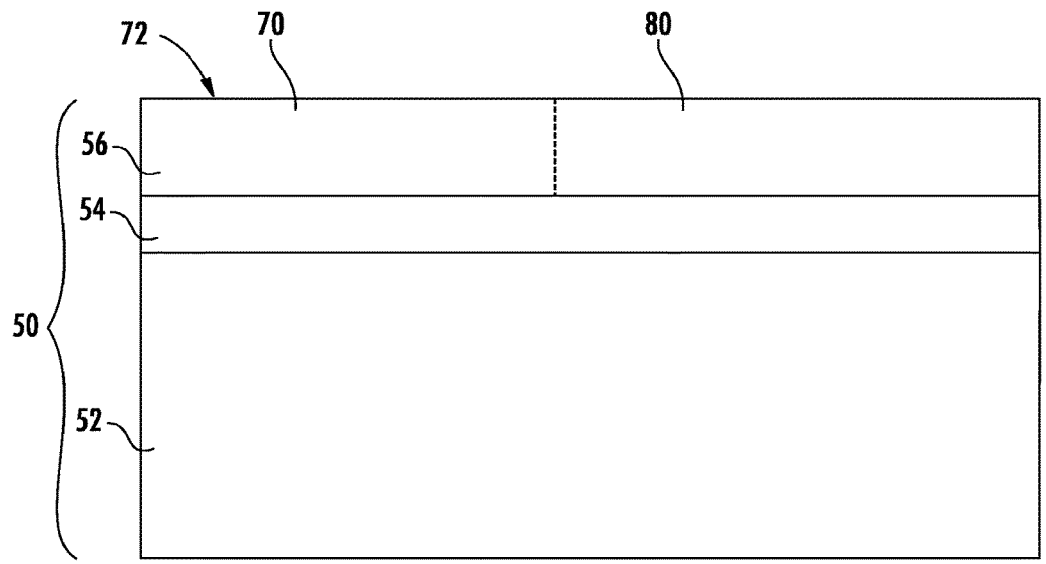
FIGS. 3-9 are a series of cross-sectional diagrams illustrating the method of FIG. 2.

A more detailed method for forming the CMOS semiconductor device 45 will now be discussed in reference to the flowchart 30 in FIG. 2 and to the process flow illustrated in FIGS. 3-8. From the start (Block 31), the method includes providing at Block 32 a stressed silicon-on-insulator (SOI) wafer 50 comprising a stressed semiconductor layer 56 having first and second laterally adjacent stressed semiconductor portions 70 and 80, as illustrated in FIG. 3. The first stressed semiconductor portion 70 defines a first active region 72.

The sSOI wafer 50 includes a semiconductor substrate or wafer 52, a buried oxide (BOX) layer 54 on the semiconductor substrate, and the stressed semiconductor layer 56 on the buried oxide layer. In one embodiment, the semiconductor substrate 52 comprises silicon, and the stressed semiconductor layer 56 also comprises silicon.

The sSOI wafer 50 may be a fully depleted SOI (FDSOI) wafer, as readily appreciated by those skilled in the art. In addition, the SOI wafer 50 may be an ultra-thin body and box (UTBB) wafer, as also readily appreciated by those skilled in the art. In one embodiment, a thickness of the semiconductor substrate 52 may be within a range of about 10 to 25 nm, and a thickness of the stressed semiconductor layer 56 may be within a range of about 7 to 10 nm, for example.

Figure 4:
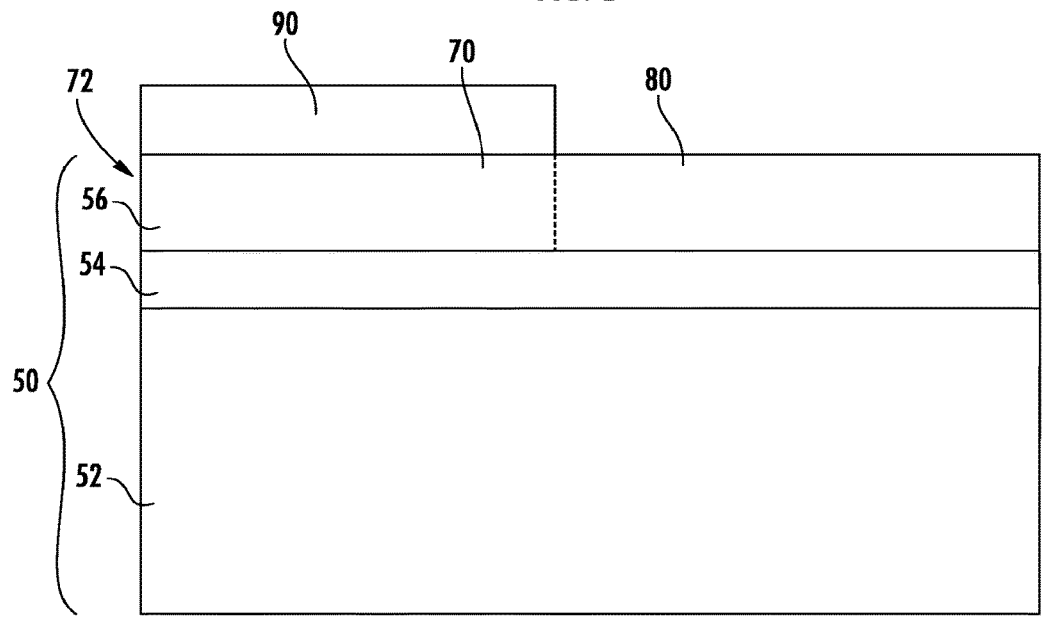

A mask layer 90 is formed over the first stressed semiconductor portion 70 at Block 34 and as illustrated in FIG. 4. The mask layer 90 protects the first stressed semiconductor portion 70 while a second active region is defined. The second active region is defined in the area corresponding to the second stressed semiconductor portion 80, which is laterally adjacent the first active region 72.

Figure 5:
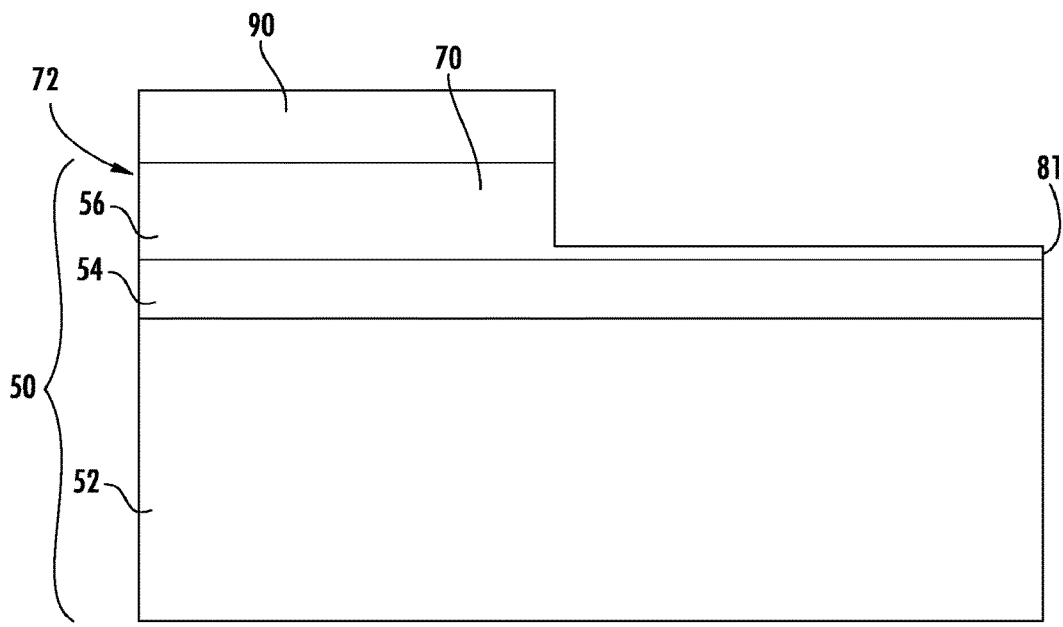
Figure 6:
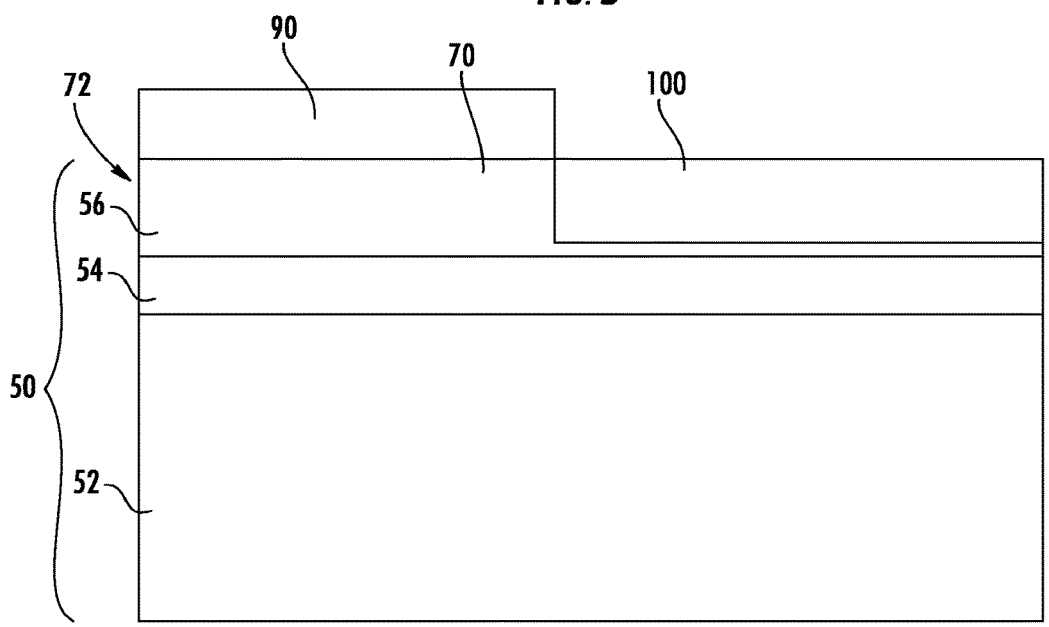

The second stressed semiconductor portion 80 is replaced with an unstressed semiconductor portion 100, as illustrated in FIG. 6. The unstressed semiconductor portion 100 includes a first semiconductor material. More particularly, replacing the second stressed semiconductor portion 80 with the unstressed semiconductor portion 100 includes removing the second stressed semiconductor portion 80 at Block 36 except for a second stressed semiconductor portion bottom layer 81, as illustrated in FIG. 5.

The second stressed semiconductor portion 80 may be thinned based on an SC1 wet etch, for example. Alternatively, oxidation may be used to thin the second stressed semiconductor portion 80. With oxidation, a thin oxide layer is deposited and then oxidation occurs. Both the SC1 wet etch and the oxidation can be well controlled so that a thickness of the second stressed semiconductor portion bottom layer 81 may be within a range of about 2 to 3 nm, as readily appreciated by those skilled in the art.

To relax the second stressed semiconductor portion bottom layer 81, a high temperature anneal may be performed at Block 38. After the annealing, the unstressed semiconductor portion 100 is formed at Block 40 on the second stressed semiconductor portion bottom layer 81 and as illustrated in FIG. 6. The first semiconductor material making up the unstressed semiconductor portion 100 may be epitaxially grown, as readily appreciated by those skilled in the art. A thickness of the unstressed semiconductor portion 100 may be within a range of about 5 to 7 nm, for example. The first semiconductor material comprises silicon, for example, and is intrinsic, i.e., undoped. Intrinsic silicon helps to ensure that a top surface of the unstressed semiconductor portion 100 is unstressed.

Figure 7:
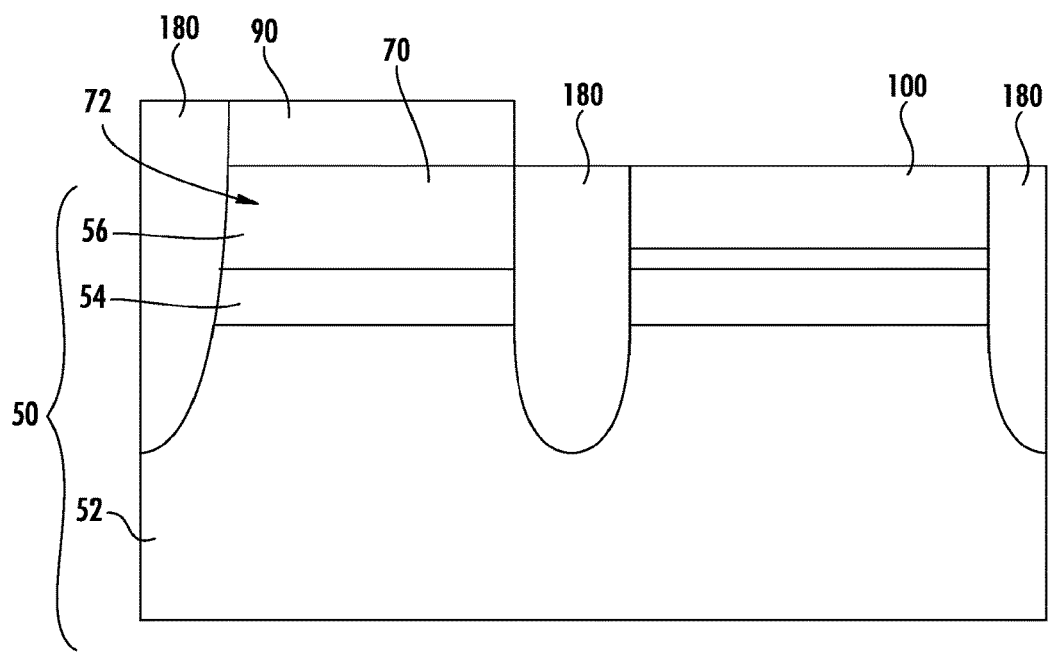

Trench isolation regions 180 are formed to bound the first active region 72 and the adjacent unstressed semiconductor portion 100, as illustrated in FIG. 7. Optionally, a chemical-mechanical polishing may be performed before the trench isolation regions 180.

Figure 8:
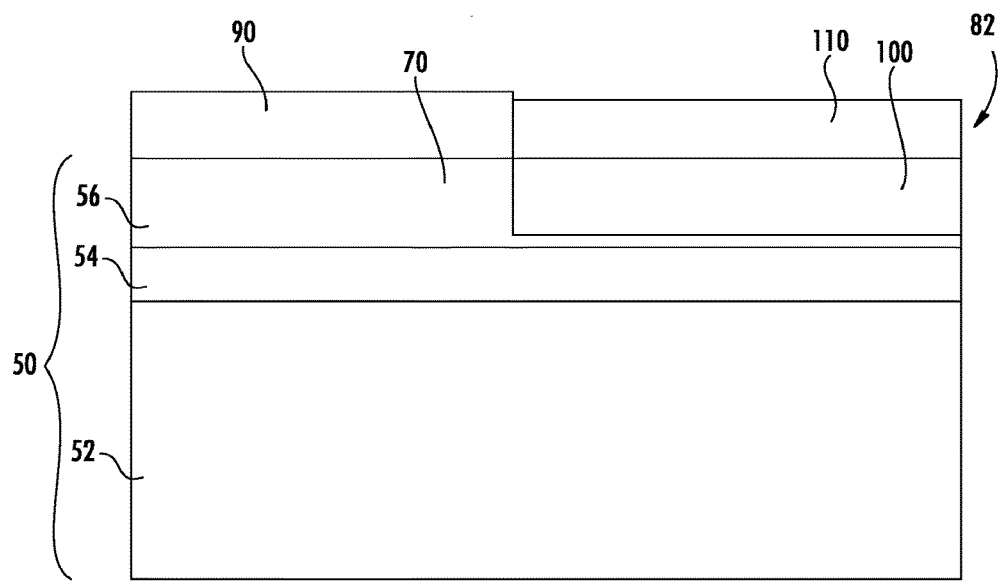

To further relax the second stressed semiconductor portion bottom layer 81, another high temperature anneal may be performed at Block 42 after forming the unstressed semiconductor portion 100. Referring now to FIG. 8, a second semiconductor material is driven into the first semiconductor material of the unstressed semiconductor portion 100 defining the second active region 82.

More particularly, driving the second semiconductor material into the first semiconductor material includes forming a second semiconductor layer 110 and comprising the second semiconductor material over the unstressed semiconductor portion 100 at Block 43. In this example, the second semiconductor material comprises silicon and germanium. The silicon and germanium forming the second semiconductor layer 110 is epitaxially grown on the unstressed semiconductor portion 100. A thickness of the second semiconductor layer 110 may be within a range of about 5 to 7 nm, for example. Driving the second semiconductor material (i.e., silicon and germanium) into the first semiconductor material (i.e., silicon) is based on oxidizing the second semiconductor layer 110 at Block 44. This forms a new second stressed semiconductor portion 112.

Figure 9:
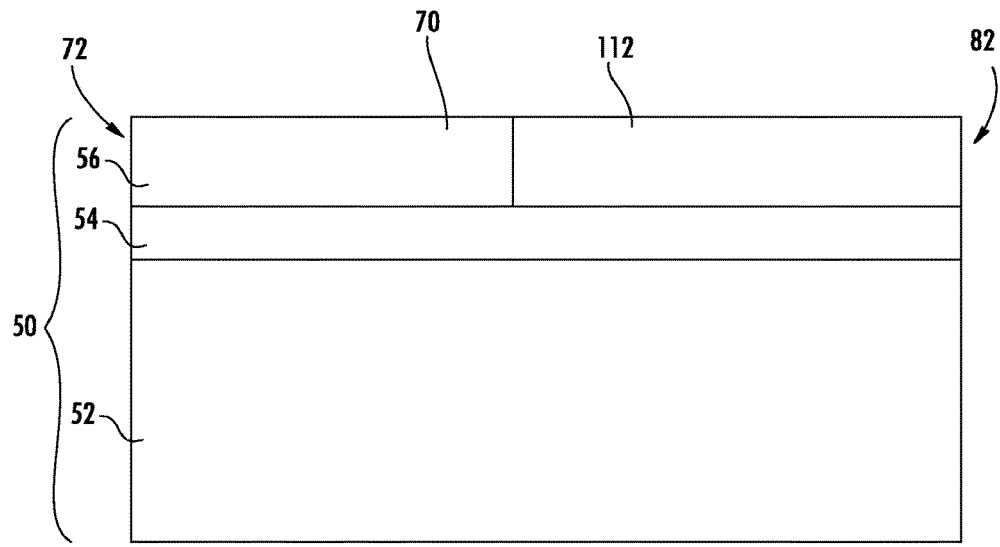

Referring now to FIG. 9, the hard mask 90 is removed and the stressed silicon-on-insulator (SOI) wafer 50 includes the first stressed semiconductor portion 70 defining the first active region 72, and the new second stressed semiconductor portion 112 defining the second active region 82. The new second stressed semiconductor portion 112 defining the second active region 82 is advantageously formed in a relatively straightforward manner without the need for complex steps.

Figure 10:
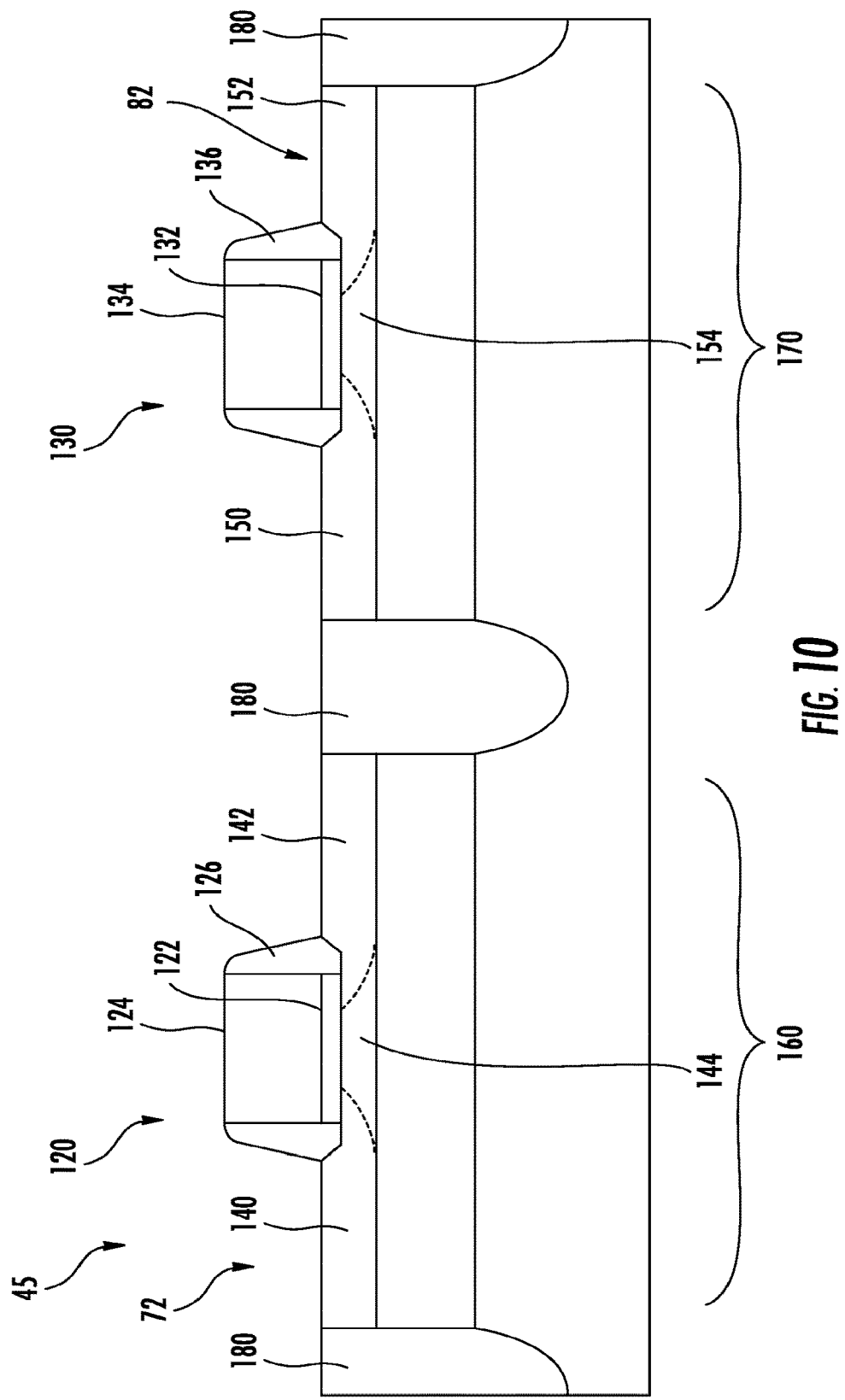
FIG. 10 is a cross-sectional diagram of the CMOS semiconductor device formed by the method of FIG. 2.

The method further comprises forming first and second gate stacks 120, 130 over the first and second active regions 72, 82, respectively, at Block 46. In the illustrated embodiment of the CMOS semiconductor device 45 shown in FIG. 10, the first gate stack 120 includes a gate dielectric layer 122, a gate electrode layer 124, and sidewall spacers 126. Similarly, the second gate stack 130 includes a gate dielectric layer 132, a gate electrode layer 134, and sidewall spacers 136.

First raised source and drain regions 140, 142 are formed at Block 47 to define a first channel 144 therebetween in the first active region 72 under the first gate stack 120. Similarly, second raised source and drain regions 150, 152 are formed at Block 48 to define a second channel 154 therebetween in the second active region 82 under the second gate stack 130.

The first channel region 144 is for an n-channel metal-oxide semiconductor field-effect transistor (nMOSFET) 160, and the second channel region 154 is for a p-channel metal-oxide semiconductor field-effect transistor (pMOSFET) 170. The nMOSFET 160 and the pMOSFET 170 are separated by a shallow trench isolation (STI) region 180. The method ends at Block 49.

In view of the above, a variety of different transistor structures may be implemented, including but not necessarily limited to: planar CMOS, high-k metal gate CMOS, PD-SOI, FD-SOI, UTBB, vertical double gate, buried gate, FinFET, tri-gate, multi-gate, 2D, 3D, raised source/drain, strained source/drain, strained channel, and combinations/hybrids thereof, for example.

Many modifications and other embodiments will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A device, comprising:
 a substrate;
 an insulating layer on the substrate: and
 a semiconductor layer on the insulating layer, the semiconductor layer having:
  a first stressed portion of a first semiconductor material; and
  a second stressed portion laterally adjacent to the first stressed portion, the second stressed portion including a first layer of the first semiconductor material on the insulating layer and a second layer of a second semiconductor material on the first layer;
 a first trench isolation region extending through the insulating layer and into the substrate, the first trench isolation region separating the first and second stressed portions; and
 a second trench isolation region extending through the insulating layer and into the substrate, the second stressed portion extending between the first trench isolation region and the second trench isolation region.

2. The device of claim 1, wherein the first layer of the second stressed portion is thinner than the first stressed portion.

3. The device of claim 1, wherein the first layer of the second stressed portion is thinner than the second layer of the second stressed portion.

4. The device of claim 1, wherein a surface of the first stressed portion is coplanar with a surface of the second stressed portion.

5. The device of claim 1, further comprising a third trench isolation region extending through the insulating layer and into the substrate, the first stressed portion extending between the first trench isolation region and the third trench isolation region.

6. The device of claim 1, further comprising:
 a first gate stack on the first stressed portion; and
 a second gate stack on the second stressed portion.

7. The device of claim 6, further comprising:
 a first source and a first drain in the first stressed portion;
 a first channel region separating the first source and the first drain;
 a second source and a second drain in the second stressed portion; and
 a second channel region separating the second source and the second drain.

8. The device of claim 7, wherein the first source and the first drain are a raised source and a raised drain, respectively.

9. A device, comprising:
 a substrate;
 a first stressed semiconductor layer on the substrate, the first stressed semiconductor layer having a first portion and a second portion adjacent to the first portion, the second portion being thinner than the first portion, the first stressed semiconductor layer including a first semiconductor material; and
 a second stressed semiconductor layer on the second portion of the first stressed semiconductor layer, the second stressed semiconductor layer including a second semiconductor material.

10. The device of claim 9, wherein a surface of the first portion of the first stressed semiconductor layer is coplanar with a surface of the second stressed semiconductor layer.

11. The device of claim 9, further comprising:
 an insulating layer on the substrate;
 a first trench isolation region extending through the insulating layer and into the substrate, the first trench isolation region separating the first portion of the first stressed semiconductor layer and the second stressed semiconductor layer; and
 a second trench isolation region extending through the insulating layer and into the substrate, the second stressed semiconductor layer extending between the first trench isolation region and the second trench isolation region.

12. The device of claim 11, further comprising a third trench isolation region extending through the insulating layer and into the substrate, the first portion of the first stressed semiconductor layer extending between the first trench isolation region and the third trench isolation region.

13. The device of claim 9, wherein the second portion of the first stressed semiconductor layer is thinner than the second stressed semiconductor layer.

14. The device of claim 9, further comprising:
a first source and a first drain in the first portion of the first stressed semiconductor layer;
a first channel region separating the first source and the first drain;
a first gate stack on the first channel region;
a second source and a second drain in the second stressed semiconductor layer;
a second channel region separating the second source and the second drain; and
a second gate stack on the second channel region.

15. The device of claim 14, wherein the first source and the first drain are a raised source and a raised drain, respectively.

16. A device, comprising:
a substrate having a first location and a second location adjacent to the first location;
a first semiconductor layer on the substrate at the first location and the second location, the first semiconductor layer including a first semiconductor material;
a second semiconductor layer on the first semiconductor layer at the second location; and
a third semiconductor layer on the second semiconductor layer at the second location, the third semiconductor layer including a second semiconductor material, the first and third semiconductor layers are stressed.

17. The device of claim 16, further comprising:
an insulating layer on the substrate;
a first trench isolation region extending through the insulating layer and into the substrate, the first trench isolation region separating a portion of the first semiconductor layer that is on the substrate at the first location and a portion of the first semiconductor layer that is on the substrate at the second location; and
a second trench isolation region extending through the insulating layer and into the substrate, the portion of first semiconductor layer that is on the substrate at the first location extending between the first trench isolation region and the second trench isolation region.

18. The device of claim 17, further comprising a third trench isolation region extending through the insulating layer and into the substrate, the portion of the first semiconductor layer that is on the substrate at the second location, the second semiconductor layer, and the third semiconductor layers extending between the first trench isolation region and the third trench isolation region.

19. The device of claim 16, wherein a portion of the first semiconductor layer that is on the substrate at the second location is thinner than the second semiconductor layer.

20. The device of claim 16, wherein a portion of the first semiconductor layer that is on the substrate at the second location is thinner than a portion of the first semiconductor layer that is on the substrate at the first location.

* * * * *